United States Patent
Buynoski et al.

(10) Patent No.: US 7,679,134 B1
(45) Date of Patent: Mar. 16, 2010

(54) FINFET DEVICE WITH MULTIPLE FIN STRUCTURES

(75) Inventors: Matthew S. Buynoski, Palo Alto, CA (US); Judy Xilin An, San Jose, CA (US); Haihong Wang, Fremont, CA (US); Bin Yu, Cupertino, CA (US)

(73) Assignee: Globalfoundries, Sunnyvale, CA (US)

( * ) Notice: Subject to any disclaimer, the term of this patent is extended or adjusted under 35 U.S.C. 154(b) by 784 days.

(21) Appl. No.: 10/754,515

(22) Filed: Jan. 12, 2004

Related U.S. Application Data

(63) Continuation of application No. 10/303,702, filed on Nov. 26, 2002, now Pat. No. 6,709,982.

(51) Int. Cl.
*H01L 29/94* (2006.01)
(52) U.S. Cl. .................. 257/329; 257/347; 257/401; 257/E29.131
(58) Field of Classification Search ................. 257/270, 257/329, 347, 401, E29.13, E29.131
See application file for complete search history.

(56) References Cited

U.S. PATENT DOCUMENTS

| | | | |
|---|---|---|---|
| 4,996,574 A | 2/1991 | Shirasaki | 257/66 |
| 5,115,289 A | 5/1992 | Hisamoto et al. | 357/23.7 |
| 5,338,959 A | 8/1994 | Kim et al. | 257/331 |
| 5,545,586 A | 8/1996 | Koh | 437/89 |
| 5,705,414 A | 1/1998 | Lustig | 438/585 |
| 5,932,911 A | 8/1999 | Yue et al. | 257/330 |
| 6,063,688 A | 5/2000 | Doyle et al. | 438/424 |
| 6,177,299 B1 | 1/2001 | Hsu et al. | 438/149 |
| 6,180,441 B1 | 1/2001 | Yue et al. | 438/197 |
| 6,232,622 B1 | 5/2001 | Hamada | 257/67 |
| 6,358,827 B1 | 3/2002 | Chen et al. | 438/585 |
| 6,413,802 B1 | 7/2002 | Hu et al. | 438/151 |
| 6,475,869 B1 | 11/2002 | Yu | 438/303 |
| 6,492,212 B1 | 12/2002 | Ieong et al. | 438/157 |
| 6,514,819 B1 | 2/2003 | Choi | 438/253 |
| 6,525,403 B2 | 2/2003 | Inaba et al. | 257/618 |
| 6,537,880 B1 | 3/2003 | Tseng | 438/260 |
| 6,562,665 B1 | 5/2003 | Yu | 438/149 |
| 6,583,469 B1 | 6/2003 | Fried et al. | 257/329 |

(Continued)

FOREIGN PATENT DOCUMENTS

DE   196 33 914 C1   8/1997

(Continued)

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.

(Continued)

*Primary Examiner*—Matthew E Warren
(74) *Attorney, Agent, or Firm*—Harrity & Harrity, LLP

(57) ABSTRACT

A semiconductor device includes a group of fin structures. The group of fin structures includes a conductive material and is formed by growing the conductive material in an opening of an oxide layer. The semiconductor device further includes a source region formed at one end of the group of fin structures, a drain region formed at an opposite end of the group of fin structures, and at least one gate.

14 Claims, 8 Drawing Sheets

U.S. PATENT DOCUMENTS

| | | | |
|---|---|---|---|
| 6,645,797 B1 | 11/2003 | Buynoski et al. | 438/157 |
| 6,657,259 B2 | 12/2003 | Fried et al. | 257/350 |
| 6,689,650 B2 * | 2/2004 | Gambino et al. | 438/157 |
| 6,696,713 B2 * | 2/2004 | Ishibashi | 257/296 |
| 6,716,686 B1 | 4/2004 | Buynoski et al. | 438/157 |
| 6,762,448 B1 * | 7/2004 | Lin et al. | 257/302 |
| 6,770,516 B2 | 8/2004 | Wu et al. | 438/154 |
| 6,794,718 B2 | 9/2004 | Nowak et al. | 257/347 |
| 2001/0005022 A1 | 6/2001 | Ogura | 257/103 |
| 2002/0011612 A1 * | 1/2002 | Hieda | 257/262 |
| 2002/0043690 A1 | 4/2002 | Doyle et al. | 257/368 |
| 2002/0060338 A1 | 5/2002 | Zhang | 257/328 |
| 2002/0153587 A1 * | 10/2002 | Adkisson et al. | 257/510 |
| 2003/0178677 A1 | 9/2003 | Clark et al. | |
| 2004/0036126 A1 | 2/2004 | Chau et al. | 257/401 |
| 2004/0099885 A1 | 5/2004 | Yeo et al. | 257/208 |
| 2004/0108545 A1 | 6/2004 | Ando | 257/329 |
| 2005/0020020 A1 * | 1/2005 | Collaert et al. | 438/300 |
| 2005/0073060 A1 * | 4/2005 | Datta et al. | 257/903 |

FOREIGN PATENT DOCUMENTS

| | | | |
|---|---|---|---|
| EP | 1 202 335 A2 | 5/2002 | |
| EP | 1202335 A2 * | 5/2002 | |
| EP | 1 383 164 A1 | 1/2004 | |
| JP | 04192564 A * | 7/1992 | |

OTHER PUBLICATIONS

Yang-Kyu Choi et al., "Nanoscale CMOS Spacer FinFET for the Terabit Era," IEEE Electron Device Letters, vol. 23, No. 1, Jan. 2002, pp. 25-27.

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

U.S. Appl. No. 10/726,569, filed Dec. 4, 2003; entitled: "Systems and Methods for Forming Multiple Fin Structures Using Metal-Induced-crystallization"; 23 pages.

U.S. Appl. No. 10/405,343, filed Apr. 3, 2003; entitled: "Method for Forming Structures in FinFET Devices"; 31 pages.

U.S. Appl. No. 10/755,344 and Preliminary Amendment; filed Jan. 13, 2004; entitled: "FinFET Device With Multiple Channels"; 24 pages.

* cited by examiner

FINFET DEVICE WITH MULTIPLE FIN STRUCTURES

RELATED APPLICATION

This application is a continuation of U.S. patent application Ser. No. 10/303,702 filed Nov. 26, 2002, now U.S. Pat. No. 6,709,982, which is hereby incorporated herein by reference.

FIELD OF THE INVENTION

The present invention relates generally to semiconductor manufacturing and, more particularly, to forming fins in FinFET devices.

BACKGROUND OF THE INVENTION

The escalating demands for high density and performance associated with ultra large scale integration semiconductor devices require design features, such as gate lengths, below 100 nanometers (nm), high reliability, and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETS to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may be fabricated using layout and process techniques similar to those used for conventional planar MOSFETs.

SUMMARY OF THE INVENTION

Implementations consistent with the principles of the invention form multiple fins in FinFET devices. By using spacers for forming the fins, narrow fins may be formed beyond the limits of lithography.

In accordance with the purpose of this invention as embodied and broadly described herein, semiconductor device is provided. The semiconductor device includes a group of fin structures, where the group of fin structures includes a conductive material and is formed by growing the conductive material in an opening of an oxide layer. The semiconductor device also includes a source region formed at one end of the group of fin structures, a drain region formed at an opposite end of the group of fin structures, and at least one gate.

In another implementation consistent with the present invention, a a semiconductor device includes silicon fin structures formed adjacent sidewalls of an opening of an oxide layer. The semiconductor device also includes a source region formed at one end of the silicon fin structures, a drain region formed at an opposite end of the silicon fin structures, and at least one gate.

In yet another implementation consistent with the principles of the invention, a method for forming a group of structures on a wafer including a conductive layer is provided. The method includes forming a layer over the conductive layer, etching at least one opening in the layer, growing a conductive material in the at least one opening, etching the conductive material to form spacers in the at least one opening, and removing the layer and a portion of the conductive layer to form the group of structures.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of invention is defined by the appended claims and their equivalents.

Implementations consistent with the principles of the invention form multiple fins in FinFET devices. Having multiple fins enables the resulting semiconductor device to increase the channel width per device as compared to single fin FinFET designs.

Exemplary Processing

Figure 1:
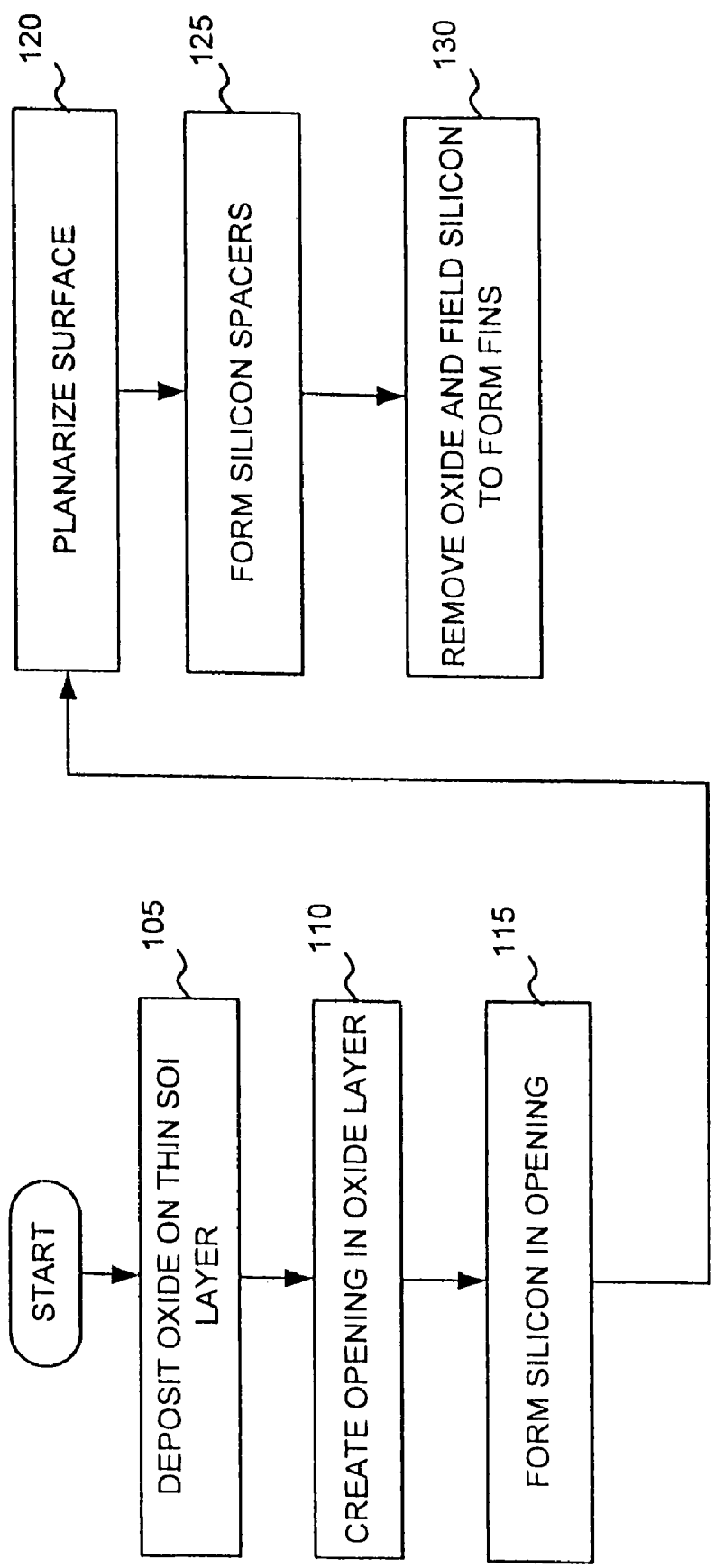
FIG. 1 illustrates an exemplary process for forming fins in a FinFET device in an implementation consistent with the principles of the invention.

FIG. 1 illustrates an exemplary process for fabricating a FinFET in an implementation consistent with the principles of the invention. FIGS. 2-8 illustrate exemplary cross-sectional views of a FinFET fabricated according to the processing described in FIG. 1.

Figure 2:
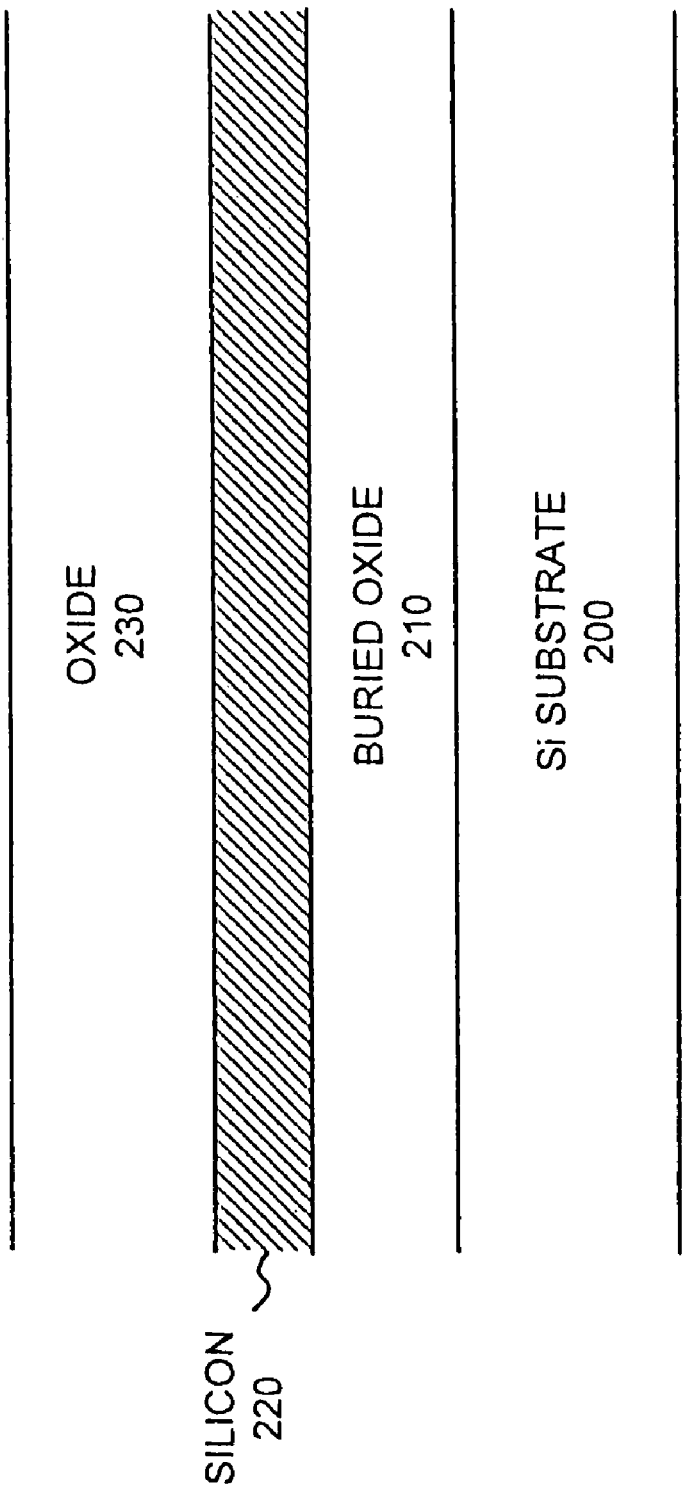
FIGS. 2-8 illustrate exemplary views of a FinFET device fabricated according to the processing described in FIG. 1.

With reference to FIGS. 1 and 2, processing may begin by depositing an oxide layer 230 on a thin silicon on insulator (SOI) structure (act 105). In one implementation consistent with the principles of the invention, oxide layer 230 may have a thickness ranging from about 500 Å to about 1000 Å. In other implementations consistent with the present invention, layer 230 may consist of other films or materials that may be deposited or grown.

The SOI structure includes a silicon substrate 200, a buried oxide layer 210, and a silicon layer 220 formed on buried oxide layer 210. Buried oxide layer 210 and silicon layer 220 may be formed on substrate 200 in a conventional manner. In an exemplary implementation, buried oxide layer 210 may include a silicon oxide and may have a thickness ranging from about 1500 Å to about 3000 Å. Silicon layer 220 may include monocrystalline or polycrystalline silicon having a thickness ranging from about 200 Å to about 500 Å.

In alternative implementations consistent with the present invention, substrate 200 and silicon layer 220 may include other materials, such as germanium, or combinations of materials, such as silicon-germanium. Buried oxide layer 210 may also include other dielectric materials.

Figure 3:
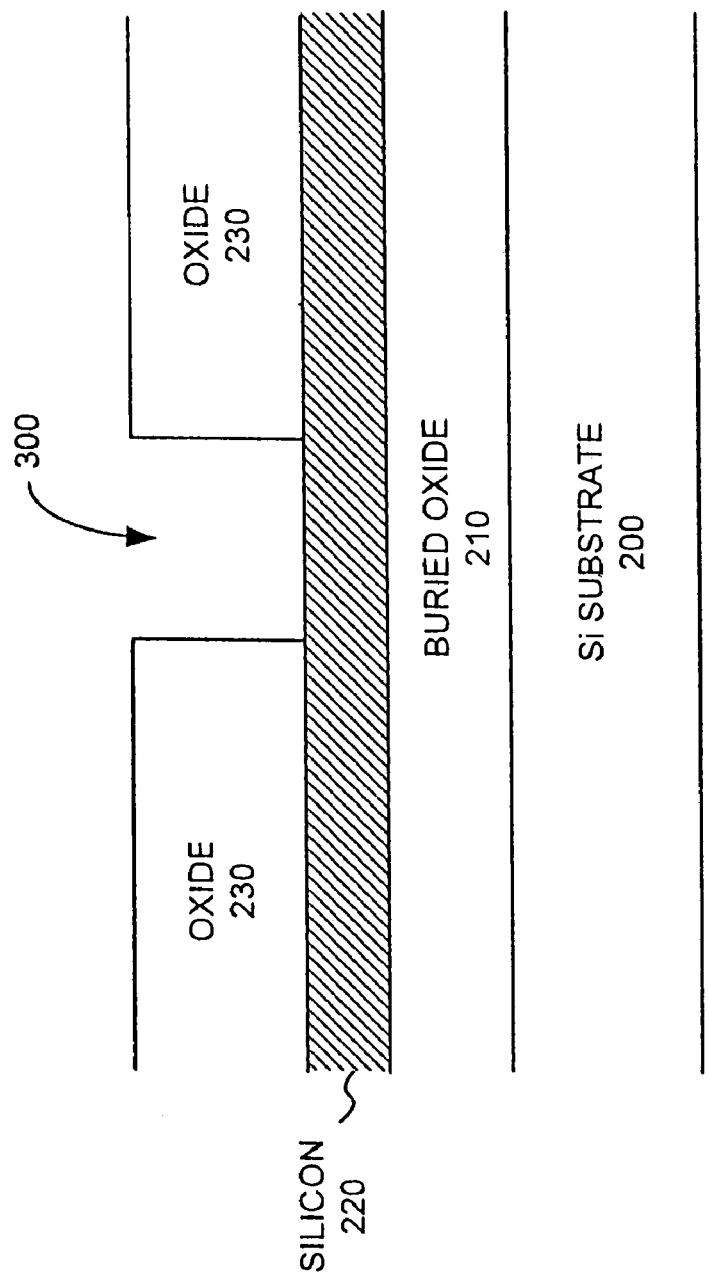

Once oxide layer 230 has been deposited, one or more openings 300 may be created in oxide layer 230, as illustrated in FIG. 3 (act 110). Only one opening 300 is illustrated in FIG. 3 for simplicity. To create opening 300, a material may be deposited and patterned to form a mask (not shown) over oxide layer 230. The mask may be deposited and patterned in any conventional manner. Oxide layer 230 may then be etched to form opening 300, with the etching terminating on silicon layer 220, as illustrated in FIG. 3. In an exemplary implementation, the width of opening 300 may range from about 1000 Å to about 2500 Å. It should be understood, however, that the particular width of opening 300 may vary based on the particular circuit requirements associated with the fins in the FinFET device that will be formed, and the capability of the lithographic system defining it.

Figure 4:
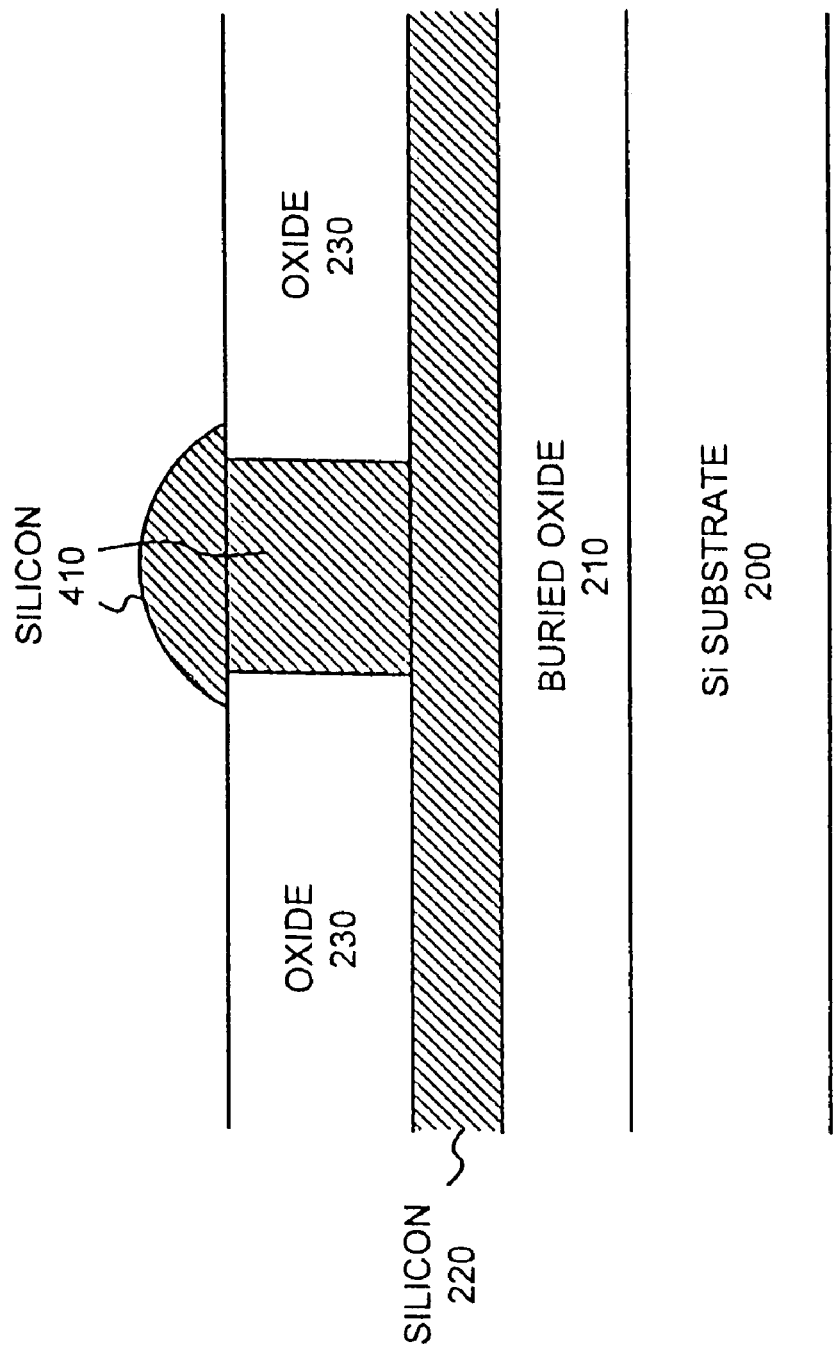
Figure 5:
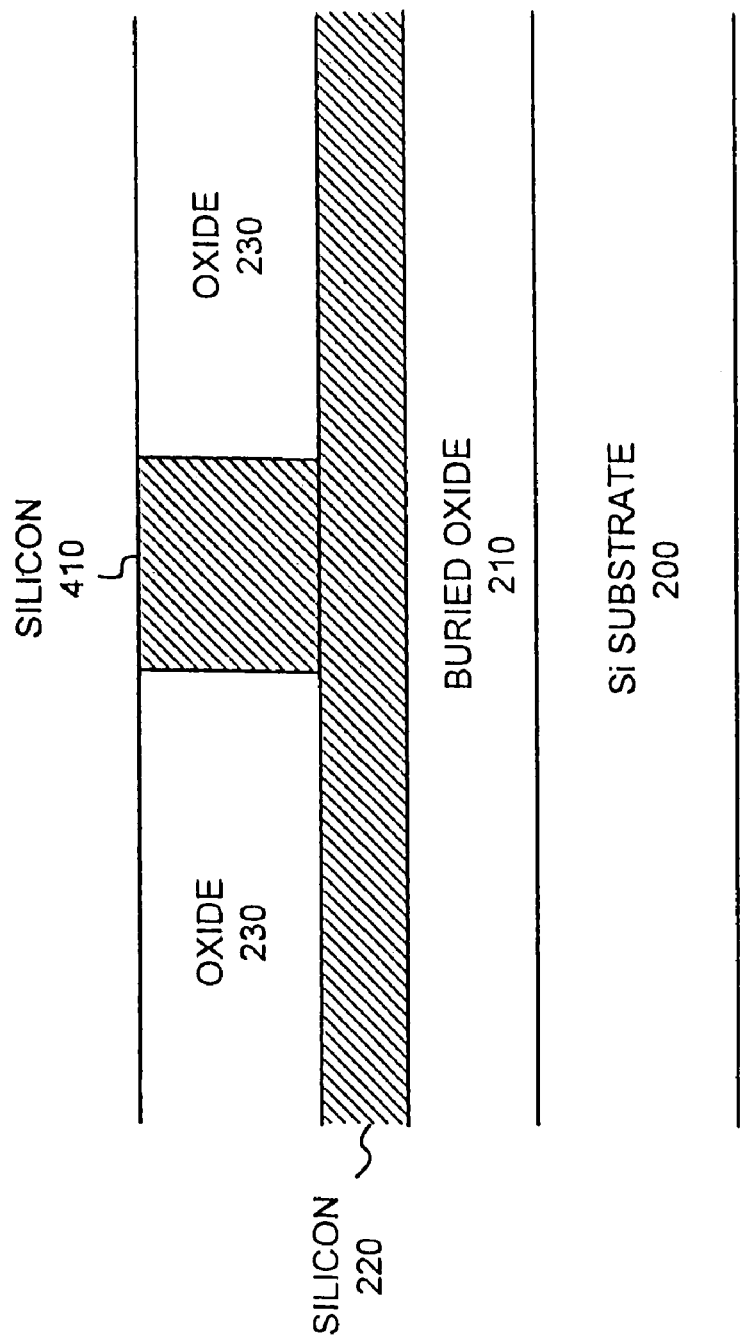

After opening 300 has been formed, silicon 410 may be selectively grown to fill opening 300, as illustrated in FIG. 4 (act 115). For example, a selective epitaxial growth (SEG) of the silicon in silicon layer 220 may be performed to fill the opening 300. During the SEG process, some silicon may grow over the top of opening 300, as illustrated in FIG. 4. A chemical-mechanical polish (CMP) or other similar technique may be performed, if necessary, to planarize the upper surface of the semiconductor device and to remove any silicon 410 that grew above the top surface of oxide layer 230, as illustrated in FIG. 5 (act 120).

Figure 6:
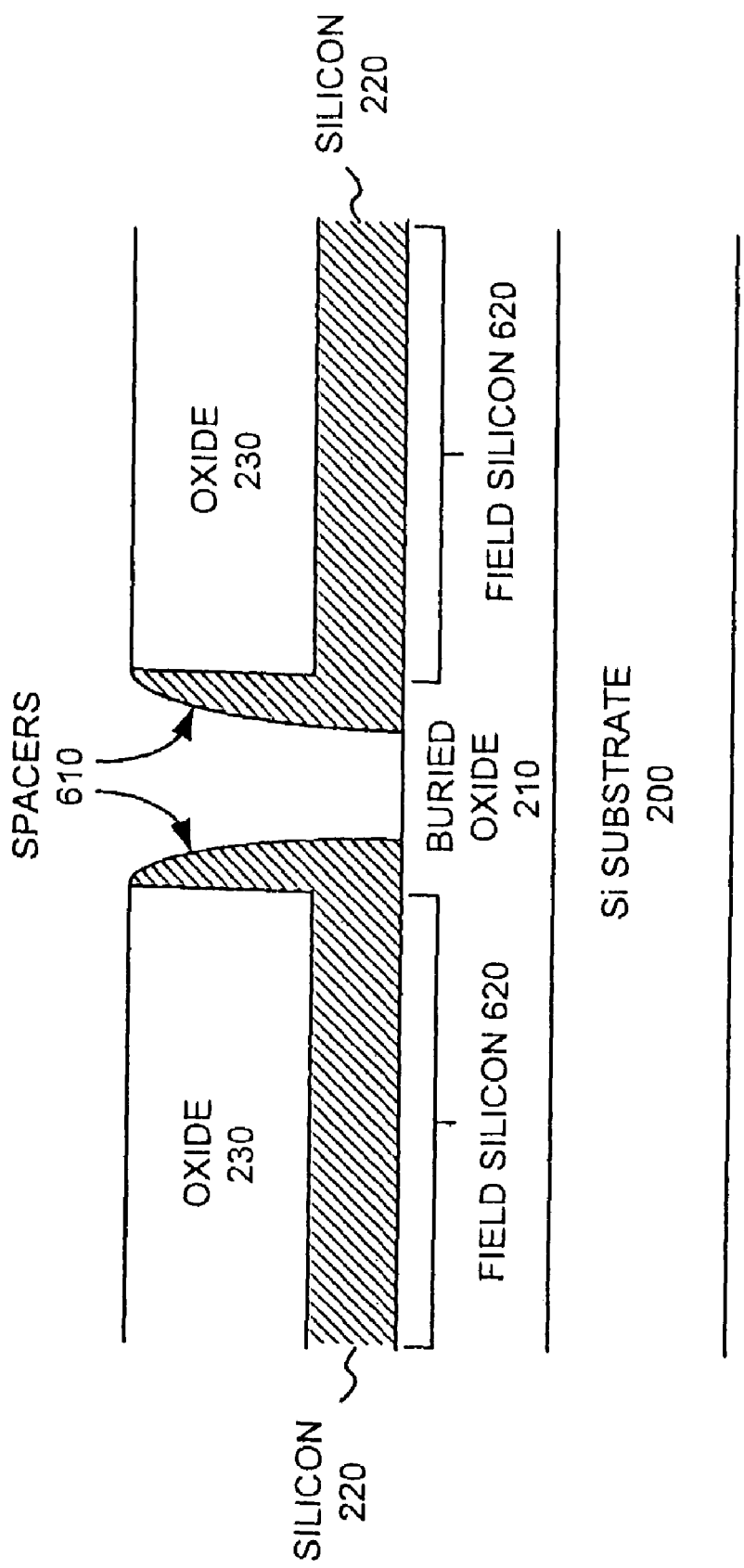

Next, silicon 410 may be etched (e.g., via a dry etch technique) in a conventional manner to form spacers 610 on the Sidewalk of opening 300, as illustrated in FIG. 6 (act 125). In one implementation, the width of each spacer 610 may range from about 200 Å to about 500 Å. However, the particular width of spacers 610 may be set based on the characteristic slope associated with the forming dry etch. As illustrated in FIG. 6, the portion of silicon layer 220 below the remaining portions of oxide layer 230 are denoted as field silicon 620.

Figure 7:
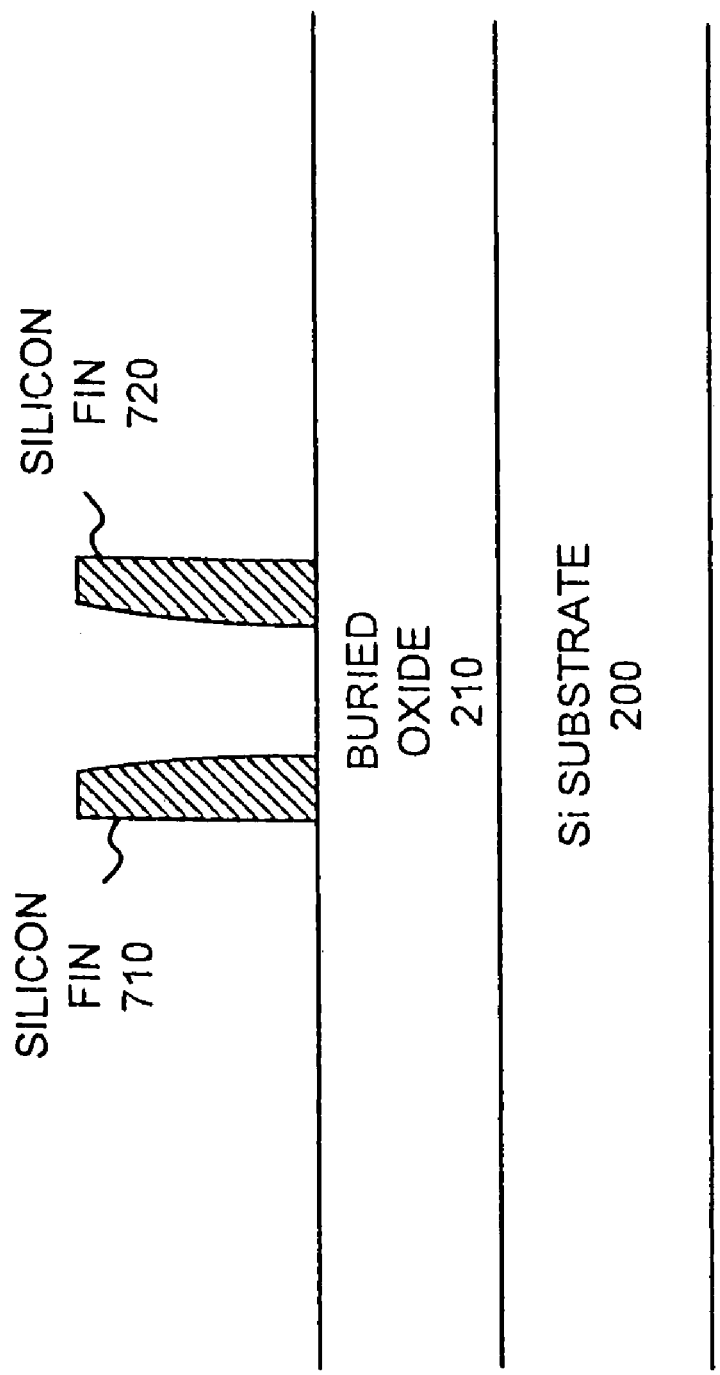

After the formation of spacers 610, two fins 710 and 720 may be formed by removing the remaining oxide layer 230 and field silicon 620, as illustrated in FIG. 7 (act 130). The remaining oxide layer 230 may be removed, for example, by etching or some other conventional technique. Field silicon 620 may be removed via, for example, a highly anisotropic dry etch or some other well known technique. As illustrated in FIG. 7, the two fins 710 and 720 are formed parallel to each other. The distance between fins 710 and 720 may vary based on the particular circuit requirements associated with the fins and FinFET device that will be formed. In one implementation, a portion of the top of fins 710 and 720 may be lost when field silicon 620 is removed. The height of fins 710 and 720 may be roughly about 700 Å to 1500 Å.

Figure 8:
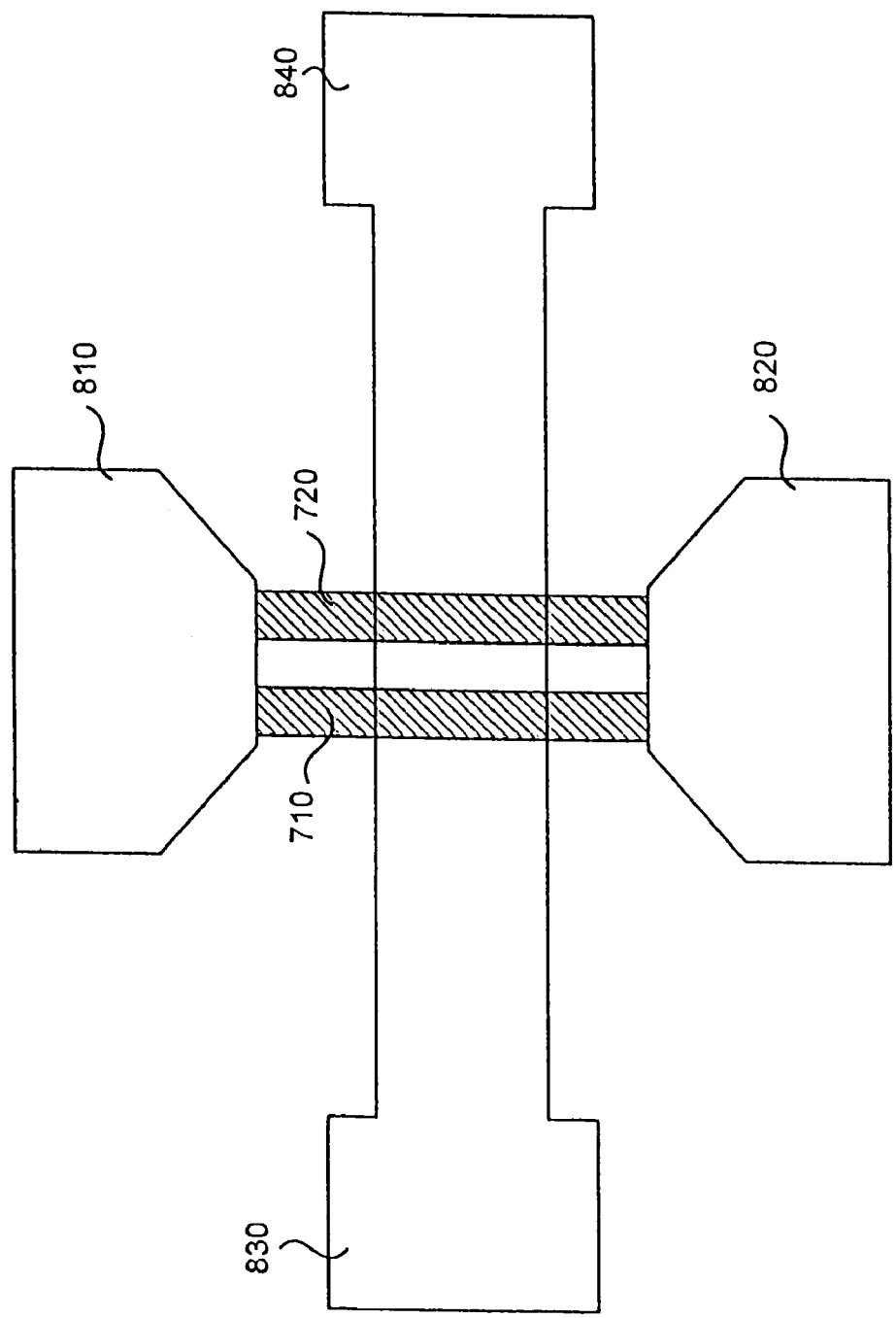

After fins 710 and 720 are formed, conventional fabrication processing can be performed to complete the transistor. For example, a gate dielectric may be formed on the side surfaces of fins 710 and 720, followed by the formation of a protective dielectric layer, such as a silicon nitride or silicon oxide, on the top surface of fins 710 and 720. Source/drain regions may then be formed at the respective ends of the fins 710 and 720, followed by formation of one or more gates. For example, a silicon layer, germanium layer, combinations of silicon and germanium or various metals may be used as the gate material. The gate material may then be patterned and etched to form the gate electrodes. For example, FIG. 8 illustrates a top view of a semiconductor device consistent with the principles of the invention after the source/drain regions and gate electrodes are formed. As illustrated, the semiconductor device may include a double gate structure with fins 710 and 720, source drain regions 810 and 820, and gate electrodes 830 and 840.

The source/drain regions 810 and 820 may then be doped with impurities, such as n-type or p-type impurities, based on the particular end device requirements. In addition, sidewall spacers may optionally be formed prior to the source/drain ion implantation to control the location, of the source/drain junctions based on the particular circuit requirements. Activation annealing may then be performed to activate the source/drain regions 810 and 820.

While the above-described processing focused on the formation of two fins, implementations consistent with the present invention are not so limited. In fact, methodology consistent with the principles of the invention may be used to form any number of fins, based on the particular circuit requirements. For example, if more than two fins are to be formed, multiple openings 300 may be formed in oxide layer 230 (FIG. 3). The processing for forming the fins may then proceed as described above with respect to acts 115 to 130.

Thus, in accordance with the present invention, a FinFET device may be formed with multiple fins. Having multiple fins enables the resulting semiconductor device to increase the channel width per device as compared to single fin FinFET designs.

CONCLUSION

Implementations consistent with the principles of the invention form multiple fins in FinFET devices. Moreover, narrow fins may be formed without requiring lithography-limiting processes.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A semiconductor structure comprising:
   an oxide layer; and
   a plurality of fin structures, the plurality of fin structures comprising a conductive material and being formed adjacent sidewalls of an opening of the oxide layer.

2. The semiconductor structure of claim 1 wherein a height of each of the plurality of fin structures ranges from about 700 Å to about 1500 Å.

3. The semiconductor structure of claim 1 wherein the conductive material comprises silicon.

4. The semiconductor structure of claim 1 wherein a width of each of the plurality of fin structures ranges from about 200 Å to 500 Å.

5. The semiconductor structure of claim 1 wherein at least one of the plurality of fin structures is formed substantially parallel to at least one other of the plurality of fin structures.

6. The semiconductor structure of claim 1 further comprising:
 a second plurality of fin structures comprising the conductive material and being formed adjacent sidewall surfaces of a different opening of the oxide layer.

7. A semiconductor structure comprising:
 an oxide layer; and
 silicon fin structures formed adjacent sidewalls of an opening of the oxide layer.

8. The semiconductor structure of claim 7 wherein the silicon fin structures include two silicon fin structures.

9. The semiconductor structure of claim 8 wherein the two silicon fin structures are formed substantially parallel to each other.

10. The semiconductor structure of claim 7 wherein a height of each of the silicon fin structures ranges from about 700 Å to about 1500 Å.

11. The semiconductor structure of claim 7 wherein a width of each of the plurality of fin structures ranges from about 200 Å to 500 Å.

12. The semiconductor structure of claim 7 wherein the silicon fin structures include multiple pairs of fin structures, each of the pairs of fin structures being formed in different openings of the oxide layer.

13. The semiconductor structure of claim 1 wherein the plurality of fin structures includes fin field effect transistor (FinFET) fins.

14. The semiconductor structure of claim 7 wherein the silicon fin structures include fin field effect transistor (FinFET) fins.

* * * * *